(12) United States Patent　　　(10) Patent No.: US 8,080,835 B2
Nakatani　　　(45) Date of Patent: Dec. 20, 2011

(54) SEMICONDUCTOR DEVICE INCLUDING A CAPACITANCE TYPE SENSOR AND METHOD OF MANUFACTURING THE SAME

(75) Inventor: Goro Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 34 days.

(21) Appl. No.: 12/230,082

(22) Filed: Aug. 22, 2008

(65) Prior Publication Data

US 2009/0050989 A1　　Feb. 26, 2009

(30) Foreign Application Priority Data

Aug. 23, 2007　(JP) ................................. 2007-217421

(51) Int. Cl.
*H01L 27/148* (2006.01)
(52) U.S. Cl. ......... 257/232; 257/233; 257/234; 257/417
(58) Field of Classification Search .................. 257/226, 257/254, 417, 444, 700, 723, 778, 233, 234, 257/232, 212, 416, 415, 418, 295, 414, 423, 257/424, 425, 426, 427, 431; 438/48, 50, 438/51, 52
See application file for complete search history.

(56) References Cited

U.S. PATENT DOCUMENTS

| | | | |
|---|---|---|---|
| 6,906,529 B2 * | 6/2005 | Blanchard | 324/662 |
| 7,068,254 B2 * | 6/2006 | Yamazaki et al. | 345/104 |
| 2002/0157475 A1 * | 10/2002 | Onose et al. | 73/754 |
| 2004/0145056 A1 | 7/2004 | Gabriel et al. | |
| 2005/0000932 A1 | 1/2005 | Gabriel et al. | |
| 2009/0045441 A1 * | 2/2009 | Kweon et al. | 257/291 |
| 2009/0047479 A1 * | 2/2009 | Nakatani et al. | 428/157 |

FOREIGN PATENT DOCUMENTS

JP　　2004-223708　　8/2004
JP　　2006-108491　　4/2006

* cited by examiner

*Primary Examiner* — Ha Tran T Nguyen
*Assistant Examiner* — Thanh Y Tran
(74) *Attorney, Agent, or Firm* — Rabin & Berdo, P.C.

(57) ABSTRACT

A semiconductor device of the present invention includes a semiconductor substrate, a semiconductor element formed in the semiconductor substrate, a surface layer formed on the semiconductor substrate, and a capacitance type sensor formed on the surface layer. The surface layer has a planar portion whose surface is planar. The capacitance type sensor includes a lower thin film parallelly opposed to the surface of the planar portion and an upper thin film opposed to the lower thin film at a prescribed interval on the side opposite to the surface layer.

15 Claims, 14 Drawing Sheets

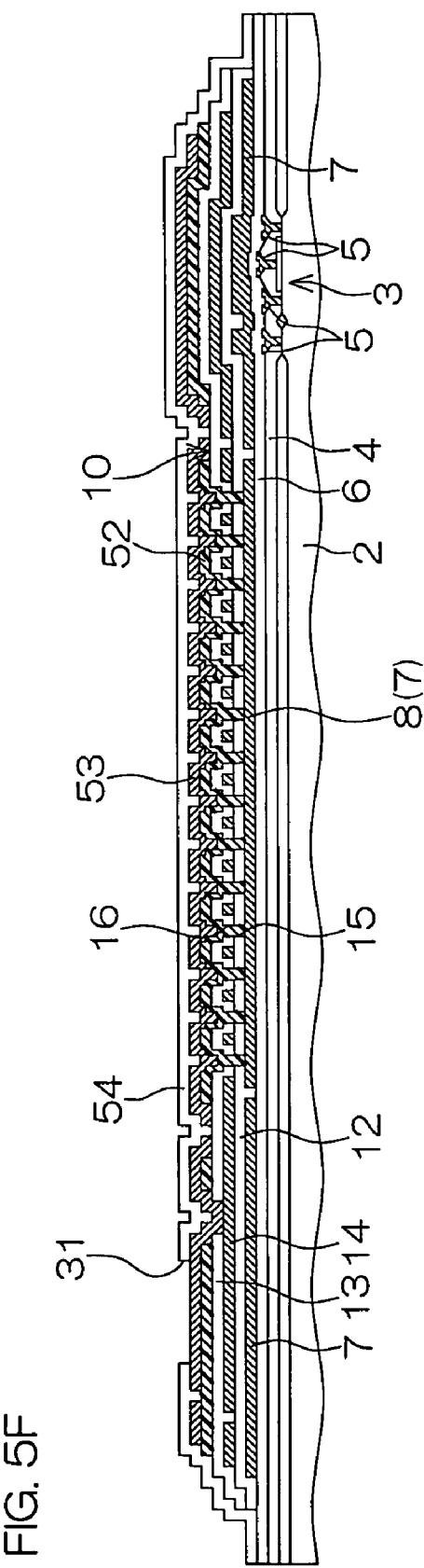

SEMICONDUCTOR DEVICE INCLUDING A CAPACITANCE TYPE SENSOR AND METHOD OF MANUFACTURING THE SAME

BACKGROUND OF THE INVENTION

1. Field of the Invention

The present invention relates to a semiconductor device including a capacitance type sensor such as an Si (silicon) microphone.

2. Description of Related Art

An Si microphone manufactured by MEMS (Micro Electro Mechanical Systems), increasingly applied to a portable telephone in place of an ECM (Electret Condenser Microphone), is widely noticed nowadays.

In order to integrate the Si microphone and an integrated circuit such as a signal processing circuit into one chip, proposed is formation of the Si microphone by a technique (CMOS processing technique) of forming a CMOS (Complementary Metal Oxide Semiconductor) device.

The Si microphone formed by the CMOS processing technique has a structure obtained by arranging a diaphragm on the surface of a silicon substrate having a recess formed at the center thereof to be opposed to the recess and opposing a back plate to the diaphragm at a small interval, for example. The silicon substrate is so provided with the recess (cavity) that the diaphragm vibrates when a sound pressure (sound wave) is input in the Si microphone. When the diaphragm vibrates while a voltage is applied between the diaphragm and the back plate, the capacitance of a capacitor formed by the diaphragm and the back plate changes, and voltage fluctuation between the diaphragm and the back plate resulting from this change of the capacitance is output as a sound output signal.

In the steps of manufacturing the conventional Si microphone, however, the recess is formed by deeply digging down the surface of the silicon substrate, and hence long-time etching is inevitably required, to disadvantageously increase the time for manufacturing the Si microphone.

SUMMARY OF THE INVENTION

An object of the present invention is to provide a semiconductor device capable of reducing the time necessary for manufacturing the same.

In a semiconductor device according to one aspect of the present invention, a capacitance type sensor including a lower thin film and an upper thin film is provided on a semiconductor substrate formed with a semiconductor element. A surface layer is formed on the semiconductor substrate. The surface layer has a planar portion whose surface is planar. The lower thin film is parallelly opposed to the surface of the planar portion. The upper thin film is opposed to the lower thin film at a prescribed interval on the side opposite to the surface layer, and enabled to vibrate in the direction opposed to the lower thin film.

In this semiconductor device, the lower thin film is preferably provided in contact with the surface of the planar portion.

In a semiconductor device according to another aspect of the present invention, a surface layer is formed on a semiconductor substrate. The surface layer has a planar portion whose surface is planar. This semiconductor device includes a lower thin film and an upper thin film. The lower thin film is provided in contact with the surface (planar surface) of the planar portion. The upper thin film is opposed to the lower thin film at a prescribed interval on the side opposite to the surface layer, and enabled to vibrate in the direction opposed to the lower thin film.

In this semiconductor device, a semiconductor element may be formed on the semiconductor substrate.

According to the structure of each semiconductor device, no recess may be formed in the semiconductor substrate or the surface layer in the steps of manufacturing the same in order to enable the upper thin film to vibrate. Therefore, no etching is required for forming a recess, and the time necessary for manufacturing the semiconductor device can be reduced.

According to the structure having the lower thin film provided in contact with the surface of the planar portion, no cavity is present between the lower thin film and the surface layer, whereby no step is required for forming such a cavity. Therefore, the time necessary for manufacturing the semiconductor device can be further reduced. Further, the lower thin film is supported on the surface, whereby the shock resistance of the capacitance type sensor can be improved.

The surface layer may be a wiring layer having a wire electrically connected with the semiconductor element.

Each semiconductor device may include an output stabilization circuit for stably outputting voltage fluctuation resulting from a capacitance change caused in the capacitance type sensor. The semiconductor element may be employed for the output stabilization circuit.

The foregoing and other objects, features and effects of the present invention will become more apparent from the following detailed description of the embodiments with reference to the attached drawings.

BRIEF DESCRIPTION OF THE DRAWINGS

FIG. 5F is a schematic sectional view showing the next step of FIG. 5E.

DETAILED DESCRIPTION OF PREFERRED EMBODIMENTS

An embodiment of the present invention is now described in detail with reference to the accompanying drawings.

Figure 1:
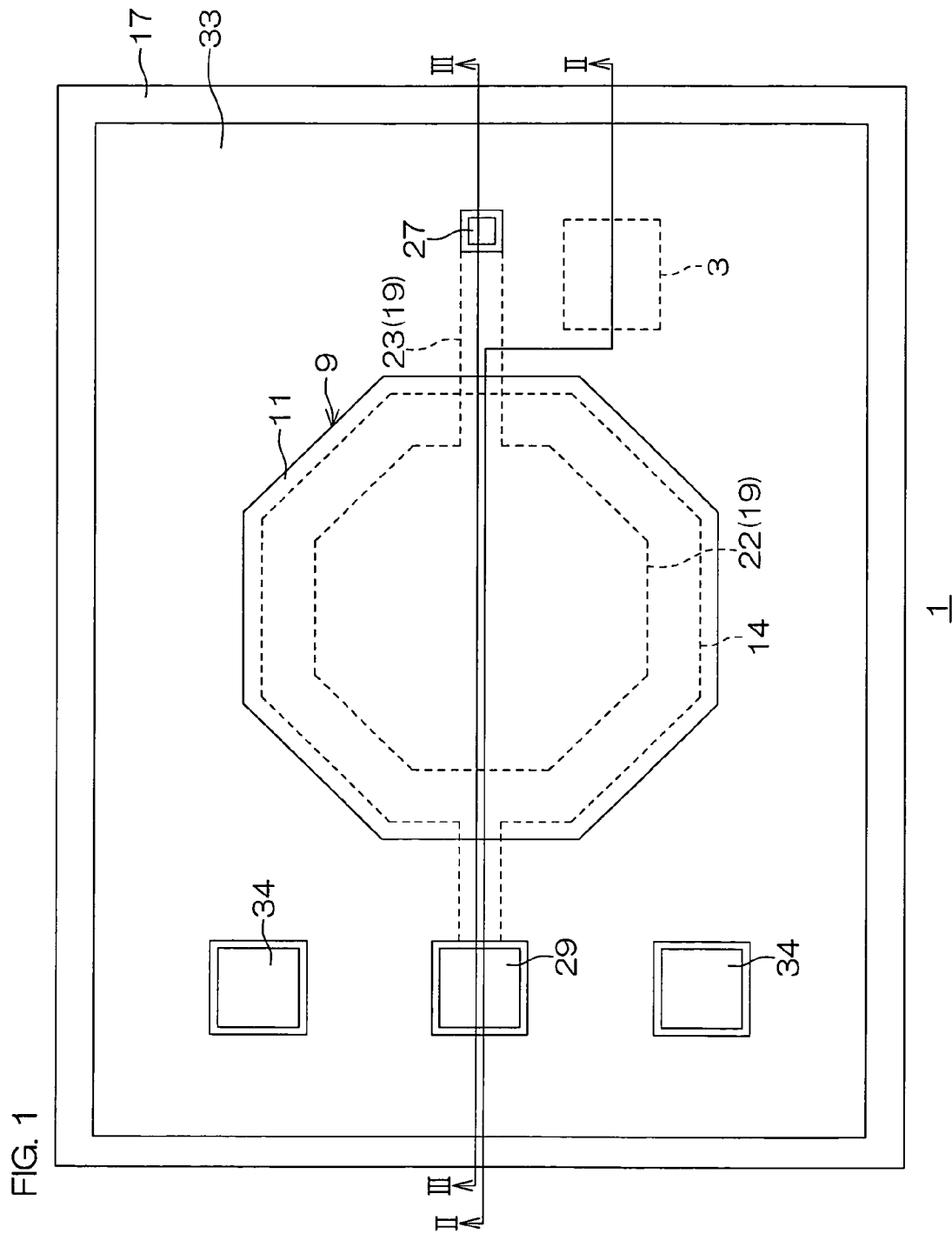
FIG. 1 is a plan view of a semiconductor device according to an embodiment of the present invention.
Figure 2:
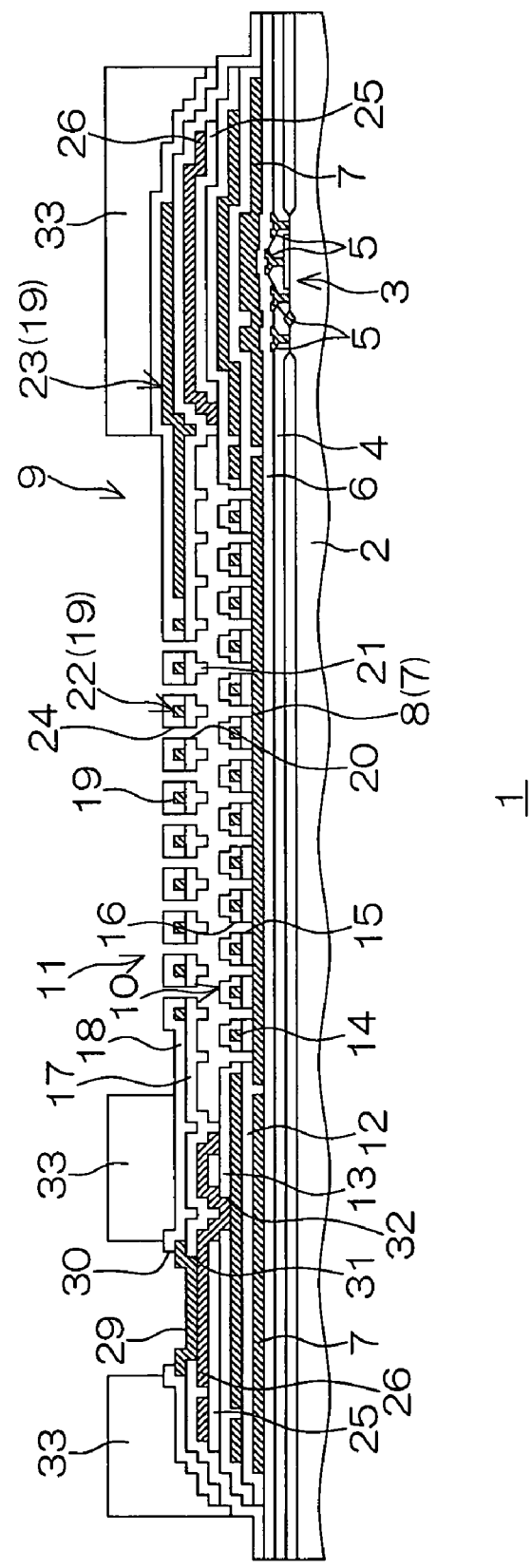
FIG. 2 is a schematic sectional view of the semiconductor device taken along the line II-II in FIG. 1.
Figure 3:
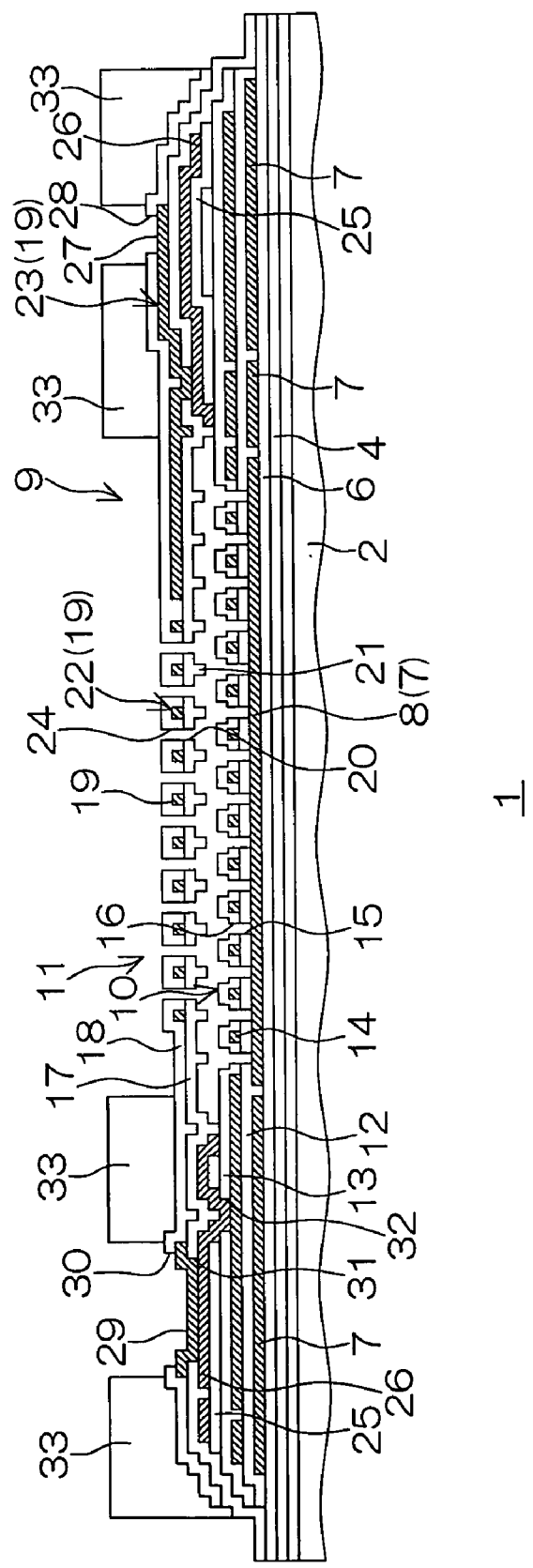
FIG. 3 is a schematic sectional view of the semiconductor device taken along the line III-III in FIG. 1.

FIG. 1 is a plan view of a semiconductor device 1 according to an embodiment of the present invention. FIG. 2 is a schematic sectional view of the semiconductor device 1 shown in FIG. 1 taken along the line II-II. FIG. 3 is a schematic sectional view of the semiconductor device 1 shown in FIG. 1 taken along the line III-III. Referring to FIGS. 2 and 3, portions other than those made of conductive materials are not hatched, in order to avoid complication of the illustrations.

The semiconductor device 1 includes a semiconductor substrate (silicon substrate, for example) 2.

In the surface layer portion of the semiconductor substrate 2, a PMOSFET (P-channel Metal Oxide Semiconductor Field-Effect Transistor) 3 as a semiconductor element is provided on an element isolation region formed by LOCOS. The PMOSFET 3 is employed for an output stabilization circuit 42 described later.

A first interlayer dielectric film 4 made of $SiO_2$ (silicon oxide) is stacked on the semiconductor substrate 2.

On the upper surface of the first interlayer dielectric film 4, a plurality of wires 5 are formed in prescribed patterns respectively. The wires 5 are made of Al (aluminum), and electrically connected with the gate, the source and the drain of the PMOSFET 3.

A second interlayer dielectric film 6 made of $SiO_2$ is stacked on the first interlayer dielectric film 4 through the wires 5. The second interlayer dielectric film 6 has a generally uniform thickness, and the surface (upper surface) thereof is planarized except portions covering the wires 5.

A wiring layer 7 as a surface layer is formed on the second interlayer dielectric film 6. The wiring layer 7 is constituted of a plurality of wires. The wiring layer 7 has a planar portion 8 whose surface is planar on the planar surface of the second interlayer dielectric film 6. The wires included in the wiring layer 7 are made of Al, and electrically connected with the wires 5 through vias (not shown) formed in the second interlayer dielectric film 6.

An Si microphone 9 as a capacitance type sensor is provided on the wiring layer 7. The Si microphone 9 includes a lower thin film 10 provided in contact with the surface of the planar portion 8 of the wiring layer 7 and an upper thin film 11 opposed to the upper portion of the lower thin film 10 at a prescribed interval.

The lower thin film 10 has a structure formed by holding a lower electrode 14 made of Al between first and second lower insulating films 12 and 13 made of SiN (silicon nitride).

The first lower insulating film 12 is formed on the second interlayer dielectric film 6 and the wiring layer 7, and collectively covers the surface (upper surface) and the side surfaces of the wiring layer 7. A large number of holes 15 are formed in portions of the lower insulating film 12 provided on the planar portion 8.

The lower electrode 14 is formed on the first lower insulating film 12. A portion of the lower electrode 14 provided on the planar portion 8 is in the form of a mesh having holes opposed to the holes 15 of the first lower insulating film 12 respectively.

The second lower insulating film 13 is stacked on the first lower insulating film 12, and covers the surface and the side surfaces of the lower electrode 14. The second lower insulating film 13 identical in shape to the first lower insulating film 12 in plan view, and has holes 16 continuous with the holes 15 of the first lower insulating film 12 respectively. Thus, the lower thin film 10 has a large number of through-holes formed by the holes 15 and 16 communicating with one another on the planar portion 8.

The upper thin film 11 has a structure formed by holding an upper electrode 19 made of Al between first and second upper insulating films 17 and 18 made of SiN.

The first upper insulating film 17 is identical in outer shape to the semiconductor substrate 2 in plan view. The outermost peripheral edge portion of the first upper insulating film 17 is formed on the second interlayer dielectric film 6. In the first upper insulating film 17, a portion inside the outermost peripheral edge portion is in contact with the second lower insulating film 13 of the lower thin film 10, and a portion inside this portion forms an opposed portion opposed to the second lower insulating film 13 at an interval. At the center of this opposed portion, a large number of holes 20 are arranged on positions deviating from those of the through-holes (holes 12 and 16) formed in the lower thin film 10 in plan view. On the lower surface of the first upper insulating film 17, protrusions 21 protruding toward the through-holes are formed on portions opposed to the through-holes formed in the lower thin film 10.

The upper electrode 19 is formed on the first upper insulating film 17. The upper electrode 19 integrally includes a mesh portion 22 having holes opposed to the holes 20 of the first upper insulating film 17 respectively and an extensional portion 23 extending from the mesh portion 22 in a prescribed direction (rightward in FIG. 1).

The second upper insulating film 18 is stacked on the first upper insulating film 17, and covers the surface and the side surfaces of the upper electrode 19. The second upper insulating film 18 has holes 24 continuous with the holes 20 of the first upper insulating film 17 respectively. Thus, the upper thin film 11 has a large number of through-holes formed by the holes 20 and 24 communicating with one another.

A first sacrificial layer residual portion 25 made of $SiO_2$ and a second sacrificial layer residual portion 26 made of Al formed on this first sacrificial layer residual portion 25 are interposed between the peripheral edge portion of the opposed portion of the first upper insulating film 17 and the second lower insulating film 13 of the lower thin film 10. Thus, the upper thin film 11 is enabled to vibrate in the direction opposed to the lower thin film 10 while having a cavity between the center of the opposed portion of the first upper insulating film 17 and the lower thin film 10.

The second upper insulating film 18 of the upper thin film 11 is provided with an opening 28 partially exposing the extensional portion 23 of the upper electrode 19 as an upper electrode pad 27.

The second upper insulating film 18 is also provided with an opening 30 exposing a lower electrode pad 29 on the side opposite to that provided with the opening 28 with respect to the mesh portion 22 of the upper electrode 19 in plan view. The lower electrode pad 29 is made of Al, and interposed between the first and second upper insulating films 17 and 18. The lower electrode pad 29 is connected to the second sacrificial layer residual portion 26 through a through-hole 31 formed in the first upper insulating film 17. The second sacrificial residual portion 26 is connected to the lower electrode 14 through a through-hole 32 continuously formed in the first sacrificial layer residual portion 25 and the second lower insulating film 13 of the lower thin film 10. Thus, the lower electrode pad 29 is electrically connected with the lower electrode 14 through the second sacrificial layer residual portion 26.

Further, the semiconductor device 1 has a protective layer 33 made of photosensitive polyimide, for example, on the outermost surface layer thereof. The protective layer 33 is so formed as to expose the portion opposed to the lower thin film 10 through the cavity, the upper electrode pad 27, the lower electrode pad 29 and another pad 34 for connection with an external device in the upper thin film 11, while completely covering the remaining portions of the upper thin film 11.

Figure 4:
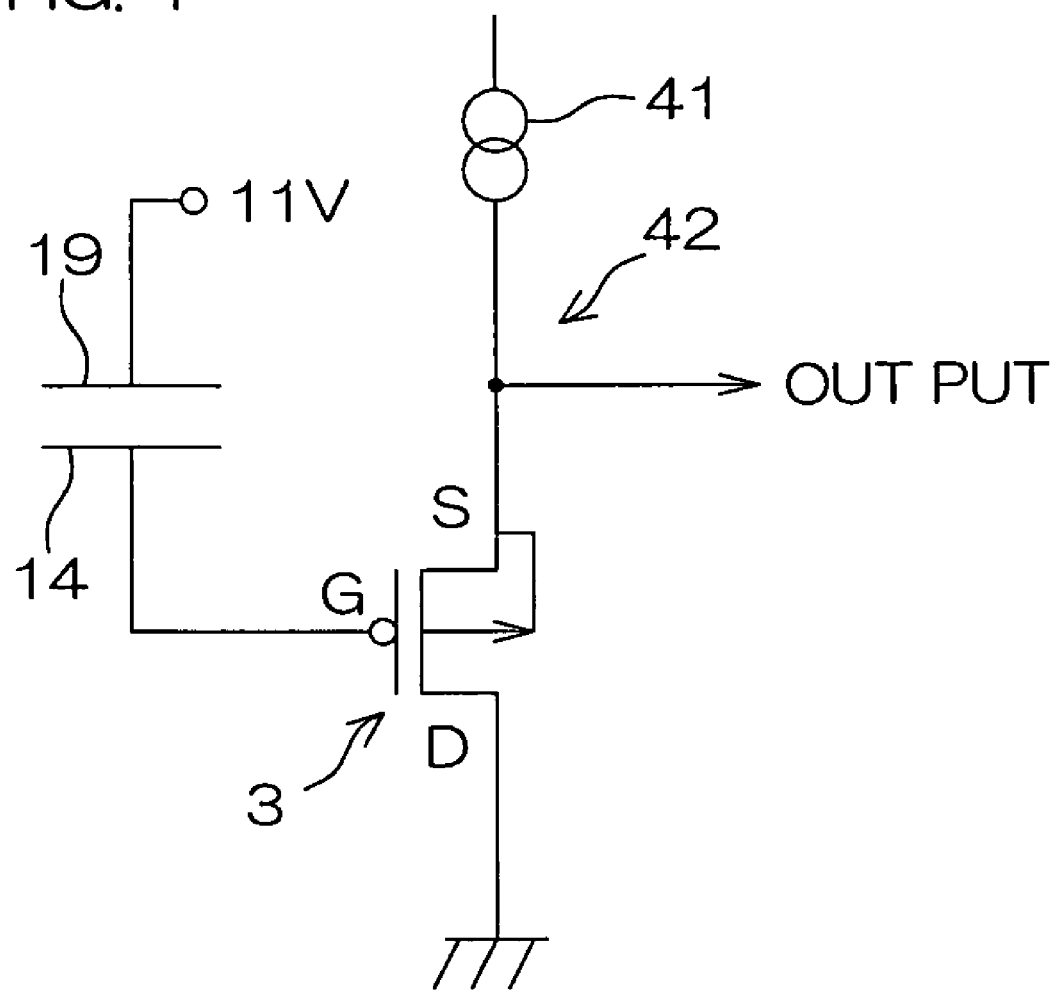
FIG. 4 is a circuit diagram of the semiconductor device.

FIG. 4 is a circuit diagram of the semiconductor device 1.

A prescribed voltage (11V, for example) is applied to the upper electrode 19 of the upper thin film 11. The lower electrode 14 of the lower thin film 10 is connected to the gate of the PMOSFET 3. The source of the PMOSFET 3 is connected to a constant current source 41. The drain of the PMOSFET 3 is grounded.

The PMOSFET 3 is employed as the output stabilization circuit 42 for stably outputting voltage fluctuation caused in the Si microphone 9. When sound pressure is input in the Si microphone 9 and the upper thin film 11 vibrates due to this sound pressure, the capacitance of a capacitor formed by the lower electrode 14 and the upper electrode 19 changes. Due to this change of the capacitance, the gate voltage of the PMOSFET 3 changes, the value of a current flowing between the source and the drain of the PMOSFET 3 changes, and the source potential of the PMOSFET 3 changes as a result. This fluctuation of the source potential of the PMOSFET 3 is output as a sound output signal, whereby a capacitance change between the lower electrode 14 and the upper electrode 19 resulting from an output terminal directly connected to the lower electrode 14 and the upper electrode 19 can be avoided, and a stable sound output signal can be obtained.

FIGS. 5A to 5J are schematic sectional views successively showing the steps of manufacturing the semiconductor device 1. FIGS. 5A to 5J partially omit hatching, in order to avoid complication of the illustrations.

Figure 5A:
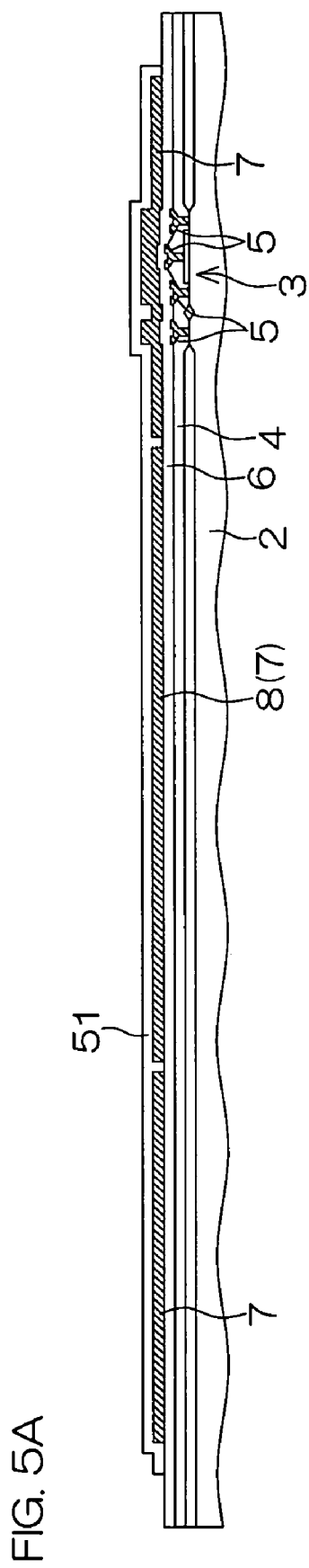
FIG. 5A is a schematic sectional view showing a step of manufacturing the semiconductor device.

First, a first SiN layer 51 is formed on the wiring layer 7 by P-CVD (Plasma Chemical Vapor Deposition), as shown in FIG. 5A. The first SiN layer 51 covers the surface and the side surfaces of the wiring layer 7.

The method of forming the PMOSFET 3 on the semiconductor substrate 2 and those of forming the first interlayer dielectric film 4, the wires 5, the second interlayer dielectric film 6 and the wiring layer 7 on the semiconductor substrate 2 are well known, and hence redundant description thereof is omitted.

Figure 5B:
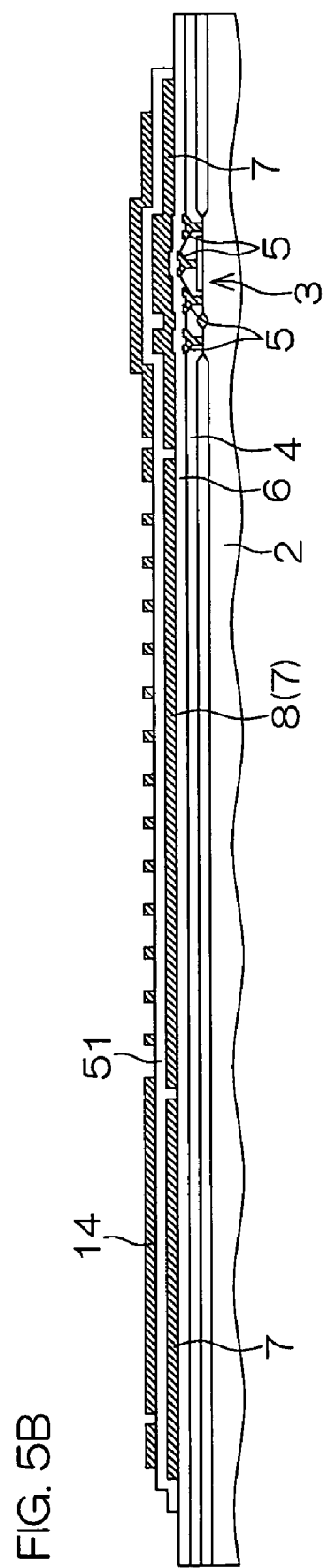
FIG. 5B is a schematic sectional view showing the next step of FIG. 5A.

Then, an Al film is formed on the first SiN layer 51 by sputtering. Then, the Al film is patterned by well-known photolithography and etching. Thus, the lower electrode 14 made of Al is formed on the first SiN layer 51, as shown in FIG. 5B.

Figure 5C:
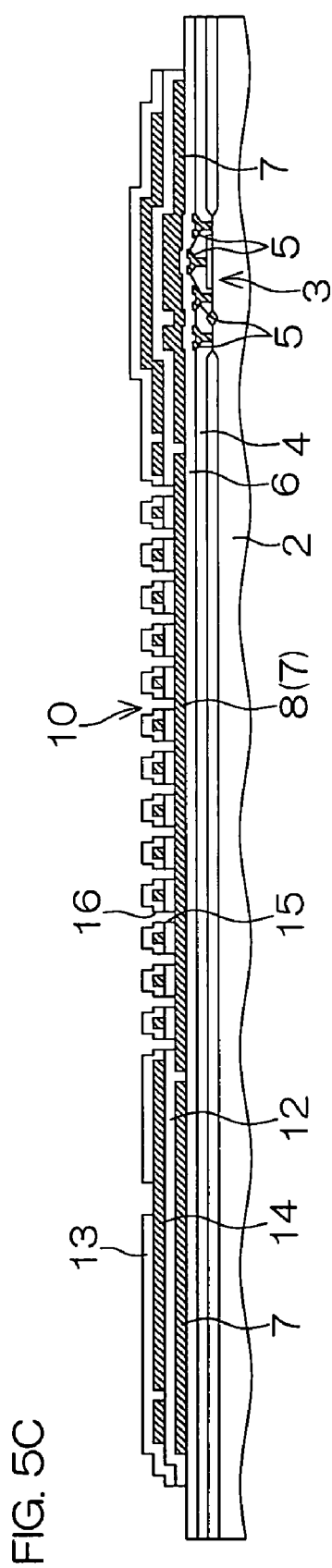
FIG. 5C is a schematic sectional view showing the next step of FIG. 5B.

Then, a second SiN layer is formed on the first SiN layer 51 and the lower electrode 14 by P-CVD. Then, the holes 15 and 16 are formed in the first SiN layer 51 and the second SiN layer respectively by well-known photolithography and etching, as shown in FIG. 5C. Thus, the first SiN layer 51 becomes the first lower insulating film 12, and the second SiN layer becomes the second lower insulating film 13. Thus, the lower thin film 10 is obtained in the structure formed by holding the lower electrode 14 between the first and second lower insulating films 12 and 13.

Figure 5D:
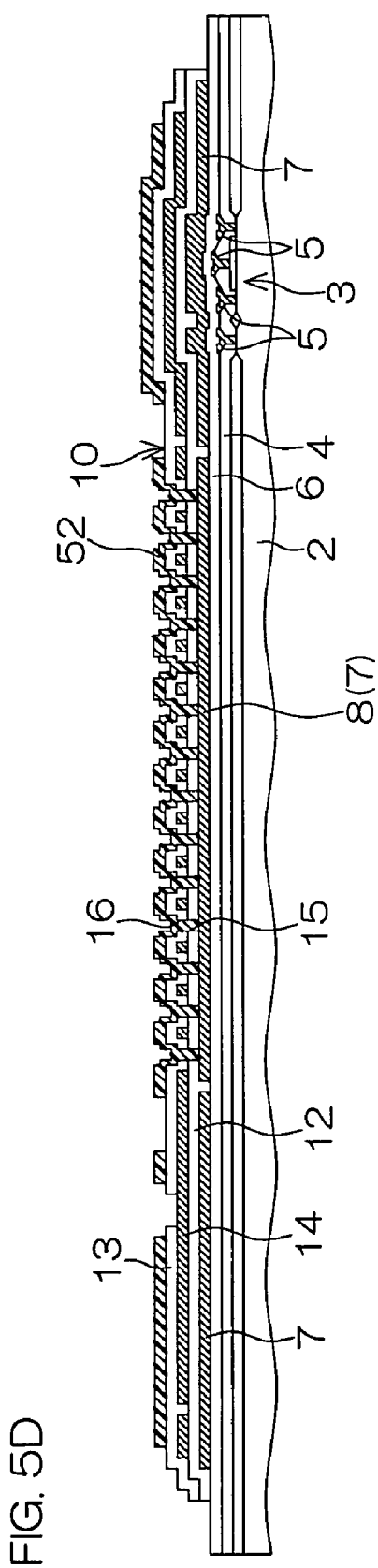
FIG. 5D is a schematic sectional view showing the next step of FIG. 5C.

Then, $SiO_2$ is deposited on the second lower insulating film 13 by P-CVD, and the deposition layer of $SiO_2$ is patterned by well-known photolithography and etching. Thus, a first sacrificial layer 52 made of $SiO_2$ is formed on the second lower insulating film 13, as shown in FIG. 5D.

Figure 5E:
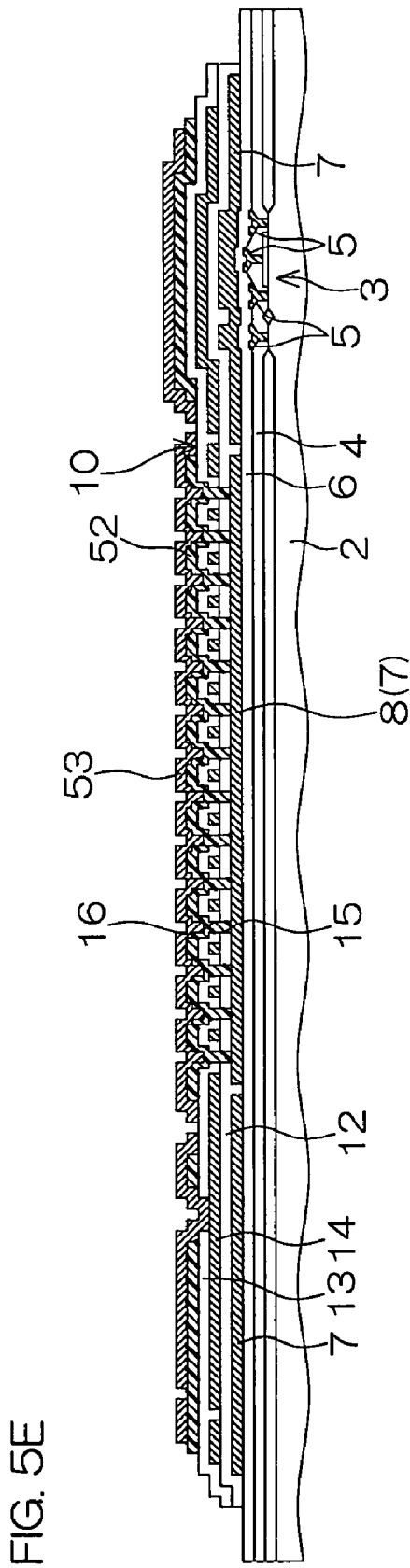
FIG. 5E is a schematic sectional view showing the next step of FIG. 5D.

Then, Al is deposited on the second lower insulating film 13 and the first sacrificial layer 52 by P-CVD, and the deposition layer of Al is patterned by well-known photolithography and etching. Thus, a second sacrificial layer 53 made of Al is formed, as shown in FIG. 5E.

After the formation of the second sacrificial layer 53, SiN is deposited on the overall area of the semiconductor substrate 2 by P-CVD, as shown in FIG. 5F. Thereafter the through-hole 31 is formed in the deposition layer of SiN by well-known photolithography and etching. Thus, a third SiN layer 54 having the through-hole 31 is formed.

Figure 5G:
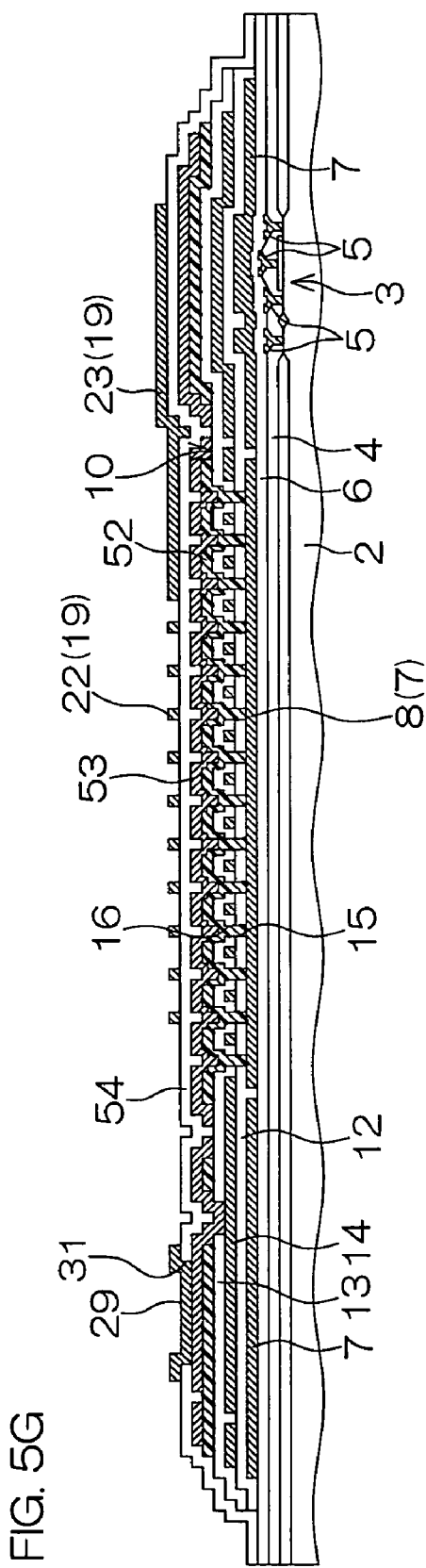
FIG. 5G is a schematic sectional view showing the next step of FIG. 5F.

Then, an Al film is formed on the third SiN layer 54 by sputtering. This Al film is patterned by well-known photolithography and etching. Thus, the upper electrode 19 and the lower electrode pad 29 made of Al are formed on the third SiN layer 54, as shown in FIG. 5G.

Figure 5H:
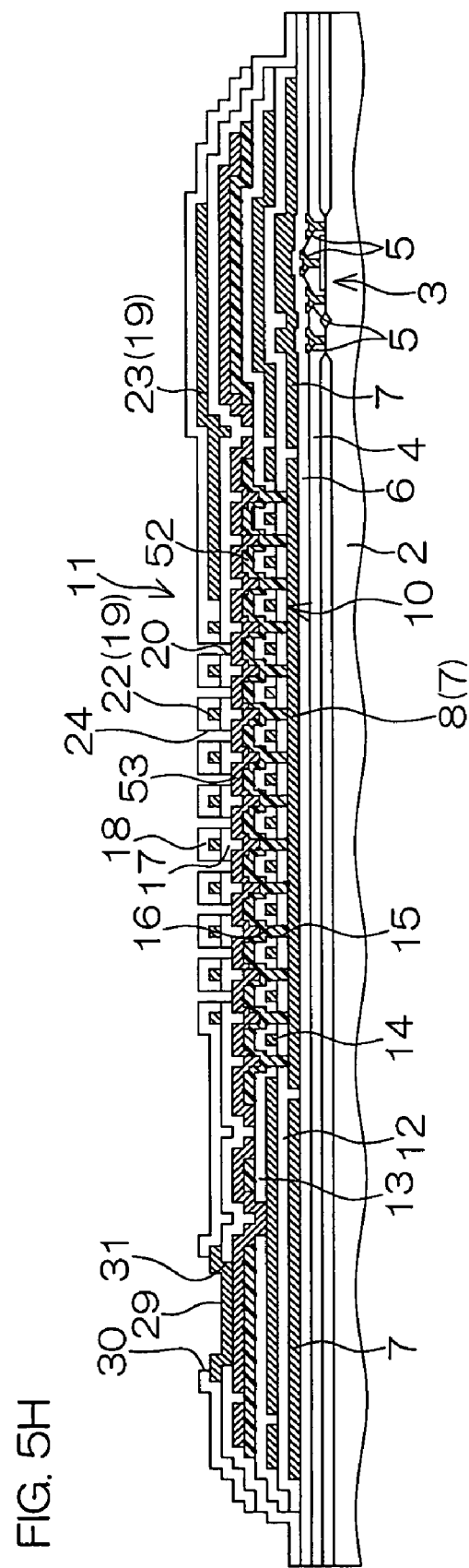
FIG. 5H is a schematic sectional view showing the next step of FIG. 5G.

Thereafter a fourth SiN layer is formed on the third SiN layer 54, the upper electrode 19 and the lower electrode pad 29 by P-CVD. Then, the holes 20 and 24 are formed in the third SiN layer 54 and the fourth SiN layer respectively by well-known photolithography and etching, as shown in FIG. 5H. Further, the openings 28 and 30 are formed in the fourth SiN layer. Thus, the third SiN layer 54 becomes the first upper insulating film 17, and the fourth SiN layer becomes the second upper insulating layer 18. Thus, the upper thin film 11 is obtained in the structure formed by holding the upper electrode 19 between the first and second upper insulating films 17 and 18.

Figure 5I:
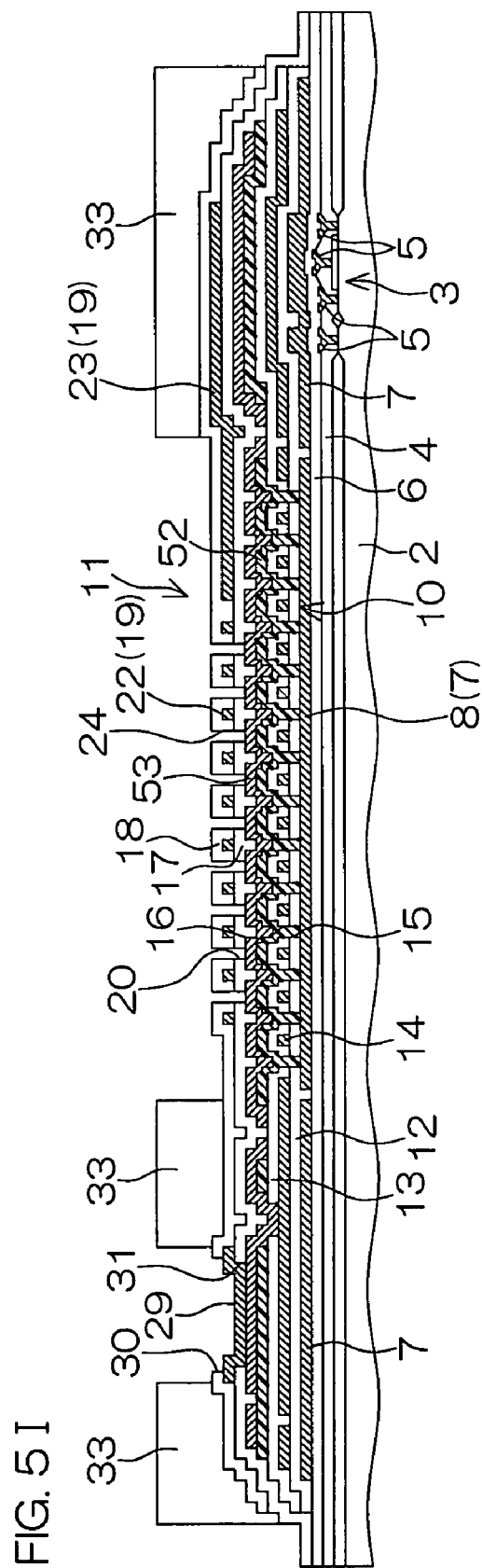
FIG. 5I is a schematic sectional view showing the next step of FIG. 5H.
Figure 5J:
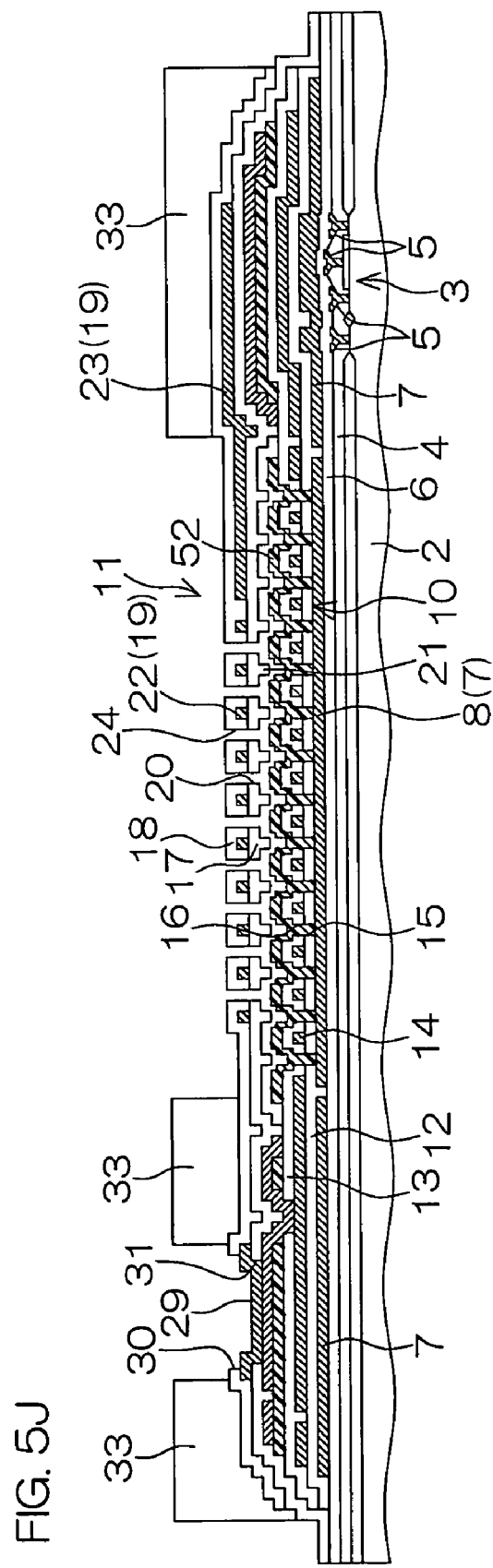
FIG. 5J is a schematic sectional view showing the next step of FIG. 5I.

Then, photosensitive polyimide is applied onto the upper thin film 11 and selectively exposed thereby forming the protective layer 33 made of the photosensitive polyimide, as shown in FIG. 5I. The first and second sacrificial layers 52 and 53 are interposed between the lower thin film 10 and the upper thin film 11, whereby the upper thin film 11 is neither deformed nor broken by the photosensitive polyimide applied onto the upper thin film 11.

Thereafter etching gas (chlorine-based gas such as $BCl_3$ (boron trichloride), for example) is supplied through the holes 20 and 24, thereby etching the second sacrificial layer 53. Thus, a cavity is formed between the upper thin film 11 and the first sacrificial layer 52, as shown in FIG. 5I.

Then, an etching solution (hydrofluoric acid, for example) is supplied into the cavity between the upper thin film 11 and the first sacrificial layer 52 from the holes 20 and 24, thereby etching the first sacrificial layer 51. Thus, the cavity is formed between the center of the opposed portion of the first upper insulating film 17 and the lower thin film 10, the upper thin film 11 is enabled to vibrate in the direction opposed to the lower thin film 10, and the semiconductor device 1 is obtained.

The first and second sacrificial layers 52 and 53 remaining between the lower thin film 10 and the upper thin film 11 become the first and second sacrificial layer residual portions 25 and 26 respectively.

In the semiconductor device 1, as hereinabove described, the Si microphone 9 including the lower thin film 10 and the upper thin film 11 is provided on the semiconductor substrate 2 formed with the PMOSFET 3. The wiring layer 7 is stacked on the semiconductor substrate 2. The wiring layer 7 has the planar portion 8 whose surface is planar. The lower thin film 10 is parallelly opposed to the surface of the planar portion 8. In other words, the surface of the planar portion 8 to which the lower thin film 10 is opposed is a planar surface having no recess in the wiring layer 7 stacked on the semiconductor substrate 2. The upper thin film 11 is opposed to the lower thin film 10 at the prescribed interval on the side opposite to the wiring layer 7 with respect to the lower thin film 10, and enabled to vibrate in the direction opposed to the lower thin film 10.

Therefore, no recess may be formed in the semiconductor substrate 2 or the wiring layer 7 in order to enable the upper thin film 11 to vibrate. Thus, no etching is required for forming such a recess, and the time necessary for manufacturing the semiconductor device 1 can be reduced.

The lower thin film 10 is provided in contact with the surface of the planar portion 8 of the wiring layer 7, and no cavity is present between the lower thin film 10 and the wiring layer 7. Therefore, no step is required for forming such a cavity between the lower thin film 10 and the wiring layer 7, and the time necessary for manufacturing the semiconductor device 1 can be further reduced. Further, the lower thin film 10 is supported on the surface, whereby the shock resistance of the Si microphone 9 can be improved.

The protective layer 33 provided on the outermost surface layer of the semiconductor device 1 can inhibit another member from colliding against the upper thin film 11. After the aforementioned steps are carried out in the state of a wafer not yet cut into each semiconductor substrate 2, a dicing tape is bonded to the upper surface of the protective layer 33, so that the wafer can be cut into each semiconductor substrate 2 with a dicing saw. The dicing tape is not in contact with the upper thin film 11, whereby the upper thin film 11 is not broken when the dicing tape is separated from the protective layer 33. The dicing tape closes an opening so formed in the protective layer 33 as to expose the upper thin film 11, thereby protecting the upper thin film 11 against cooling water supplied to the dicing saw. Thus, the Si microphone 9 can be prevented from breakage resulting from the cooling water.

The first and second lower insulating films 12 and 13 and the first and second upper insulating films 17 and 18 may alternatively be made of $SiO_2$ or a Low-k film material having a lower dielectric constant than $SiO_2$ in place of SiN, so far as the material has insulating properties.

The material for the first sacrificial layer 52 is not restricted to $SiO_2$, but the first sacrificial layer 52 may alternatively be made of another material having an etching selection ratio with the materials for the wiring layer 7, the first and second lower insulating films 12 and 13 and the first and second upper insulating films 17 and 18. When the wiring layer 7 is made of Al and the first and second lower insulating films 12 and 13 and the first and second upper insulating films 17 and 18 are made of $SiO_2$, for example, SiN may be employed as the material for the first sacrificial layer 52.

The material for the second sacrificial layer 53 is not restricted to Al, but the second sacrificial layer 53 may alternatively be made of another material having an etching selection ratio with the material for the first and second lower insulating films 12 and 13 and the first and second upper insulating films 17 and 18.

While the semiconductor device 1 includes the output stabilization circuit 42 employing the PMOSFET 3, the semiconductor device 1 may alternatively include another type of circuit, such as a charge pumping circuit, an A-D converter, a bias circuit, an oscillation circuit or a current source employing a semiconductor element.

While the Si microphone 9 is employed as the example of the capacitance type sensor, the present invention is not restricted to this but may alternatively be applied to a pressure sensor or an acceleration sensor operating by sensing a change in the capacitance.

While the present invention has been described in detail by way of the embodiments thereof, it should be understood that these embodiments are merely illustrative of the technical principles of the present invention and not limitative of the invention. The spirit and scope of the present invention are to be limited only by the appended claims.

This application corresponds to Japanese Patent Application No. 2007-217421 filed with the Japanese Patent Office on Aug. 23, 2007, the disclosure of which is incorporated herein by reference.

What is claimed:

1. A semiconductor device including:
a semiconductor substrate;
a semiconductor element formed in the semiconductor substrate;
a surface layer formed over the semiconductor substrate; and
a capacitance type sensor formed over the surface layer,
wherein the surface layer has a planar portion whose surface is planar, and a wiring layer is provided on a surface of the planar portion,
wherein the capacitance type sensor comprises:
a lower thin film disposed directly in contact with the wiring layer on the planar portion; and
an upper thin film opposed to the lower thin film with a prescribed space intervention on the side opposite to the surface layer, at least one hole being formed through the upper thin film, and the upper thin film being enabled to vibrate in the direction opposed to the lower thin film.

2. The semiconductor device according to claim 1, wherein the wiring layer includes a wire electrically connected with the semiconductor element.

3. The semiconductor device according to claim 1, further including:
an output stabilization circuit for stably outputting voltage fluctuation resulting from a capacitance change caused in the capacitance type sensor,
wherein the semiconductor element is employed for the output stabilization circuit.

4. The semiconductor device according to claim 1, wherein at a center of the opposed portion of the upper thin film, a plural number of holes are formed in the form of a mesh.

5. The semiconductor device according to claim 4, wherein the lower thin film has a structure formed by holding a lower electrode between first and second lower insulating films; and
the upper thin film has a structure formed by holding an upper electrode between first and second upper insulating films.

6. The semiconductor device according to claim 5, wherein a plural number of through-holes are formed in the lower thin film; and
the plural number of holes in the upper thin film and the plural number of through-holes in the lower thin film are arranged on portions deviating from each other in plain views.

7. The semiconductor device according to claim 6, wherein on the lower surface of the first upper insulating film, protrusions protruding toward the through-holes are formed on portions opposed to the through-holes formed in the lower thin film.

8. A semiconductor device including:
a semiconductor substrate;
a surface layer, formed over the semiconductor substrate, having a planar portion whose surface is planar;
a wiring layer disposed on a surface of the planar portion; and
a capacitance type sensor disposed over the surface layer, the capacitance type sensor including:
a lower thin film disposed directly in contact with the wiring layer on the planar portion; and
an upper thin film opposed to the lower thin film with a prescribed space intervention, at least one hole being formed through the upper thin film, and the upper thin film being enabled to vibrate in the direction opposed to the lower thin film.

9. The semiconductor device according to claim 8, further comprising a semiconductor element formed in the semiconductor substrate, and wherein the wiring layer includes a wire electrically connected with the semiconductor element.

10. The semiconductor device according to claim 9, further including:
   an output stabilization circuit for stably outputting voltage fluctuation resulting from a capacitance change caused in the capacitance type sensor,
   wherein the semiconductor element is employed for the output stabilization circuit.

11. The semiconductor device according to claim 8, wherein at a center of the opposed portion of the upper thin film, a plural number of holes are formed in the form of a mesh.

12. The semiconductor device according to claim 11, wherein
   the lower thin film has a structure formed by holding a lower electrode between first and second lower insulating films; and
   the upper thin film has a structure formed by holding an upper electrode between first and second upper insulating films.

13. The semiconductor device according to claim 12, wherein
   a plural number of through-holes are formed in the lower thin film; and
   the plural number of holes in the upper thin film and the plural number of through-holes in the lower thin film are arranged on portions deviating from each other in plain views.

14. The semiconductor device according to claim 12, wherein on the lower surface of the first upper insulating film, protrusions protruding toward the through-holes are formed on portions opposed to the through-holes formed in the lower thin film.

15. A semiconductor device including:
   a semiconductor substrate;
   a semiconductor element formed in the semiconductor substrate;
   a surface layer disposed above the semiconductor substrate, the surface layer having a planar portion whose surface is planar;
   a wiring layer disposed on the planar portion of the surface layer; and
   a sensor disposed above the wiring layer,
   wherein the sensor comprises:
      a lower capacitor plate portion disposed in contact with the wiring layer; and
      an upper capacitor plate portion that is disposed above the lower capacitor plate portion and that is spaced apart from the lower capacitor plate portion by an air space, the upper capacitor plate portion having at least one hole, the upper capacitor plate portion being enabled to vibrate with respect the lower capacitor plate portion.

* * * * *